United States Patent
Chou et al.

(10) Patent No.: US 8,622,790 B2
(45) Date of Patent: Jan. 7, 2014

(54) AIRFLOW GUIDE

(75) Inventors: Chia-Shin Chou, Taipei Hsien (TW); Zhen-Xing Ye, Shenzhen (CN); Xian-Guang Tan, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 745 days.

(21) Appl. No.: 12/768,104

(22) Filed: Apr. 27, 2010

(65) Prior Publication Data

US 2011/0189935 A1 Aug. 4, 2011

(30) Foreign Application Priority Data

Feb. 4, 2010 (CN) .......................... 2010 1 0301182

(51) Int. Cl.
*H05K 5/00* (2006.01)
(52) U.S. Cl.
USPC ......................................................... 454/184
(58) Field of Classification Search
USPC .......... 454/184, 284, 333, 324, 298; 361/690, 361/695, 296
See application file for complete search history.

(56) References Cited

U.S. PATENT DOCUMENTS

| 4,447,856 | A * | 5/1984 | Takahashi et al. | 361/692 |
|---|---|---|---|---|
| 6,736,196 | B2 * | 5/2004 | Lai et al. | 165/122 |
| 2006/0291170 | A1 * | 12/2006 | Hsiao | 361/704 |
| 2008/0160899 | A1 * | 7/2008 | Henry et al. | 454/184 |
| 2009/0129013 | A1 * | 5/2009 | Donowho et al. | 361/690 |

FOREIGN PATENT DOCUMENTS

| CN | 201115221 Y | 9/2008 |
|---|---|---|
| CN | 201178538 Y | 1/2009 |

* cited by examiner

*Primary Examiner* — Steven B McAllister
*Assistant Examiner* — Brittany E Towns
(74) *Attorney, Agent, or Firm* — Altis Law Group, Inc.

(57) ABSTRACT

An airflow guide includes a top cover and two side covers. The two side covers are disposed on opposite ends of the top cover. At least one of the two side covers includes a base plate and a sliding plate. The base plate is fixedly connected to the top cover. The sliding plate is slidably connected to the base plate. The sliding plate slides relative to the base plate, such that an air inlet is defined in the at least one of the two side covers.

6 Claims, 6 Drawing Sheets

AIRFLOW GUIDE

BACKGROUND

1. Technical Field

The present disclosure relates to heat dissipation, and particularly, to an airflow guide applied in an electronic device.

2. Description of the Related Art

An electronic device (for example, a computer server) consists of many parts such as a disk drive, a power supply, a motherboard and components such as memory, IC components, CPU (central processing units), and others, assembled on the motherboard. Heat generated by the electronic components of the electronic device requires prompt dissipation. As performance parameters of the components are increased, the generated heat increases commensurately. Therefore, the electronic device usually includes a fan provided with an airflow guide to dissipate the heat generated by the electronic components.

A typical airflow guide is fixed in a computer case, and a fan is provided with the airflow guide to dissipate excess heat. The airflow guide is disposed on the CPU and the power supply. The airflow guide includes a top cover and two side covers. The side covers extend perpendicularly to opposite ends of the top cover respectively. The side covers and top cover cooperatively define an air inlet adjacent to the CPU and an air outlet adjoining the power supply. Heat dissipation consists of the fan generating airflow into the air inlet and airflow passing through a plurality of electronic components and the convection heat generated by the CPU. However, at this time, the airflow temperature may have been elevated to a point where it no longer is efficient enough in removing the heat generated by the heat dissipating electronic components.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
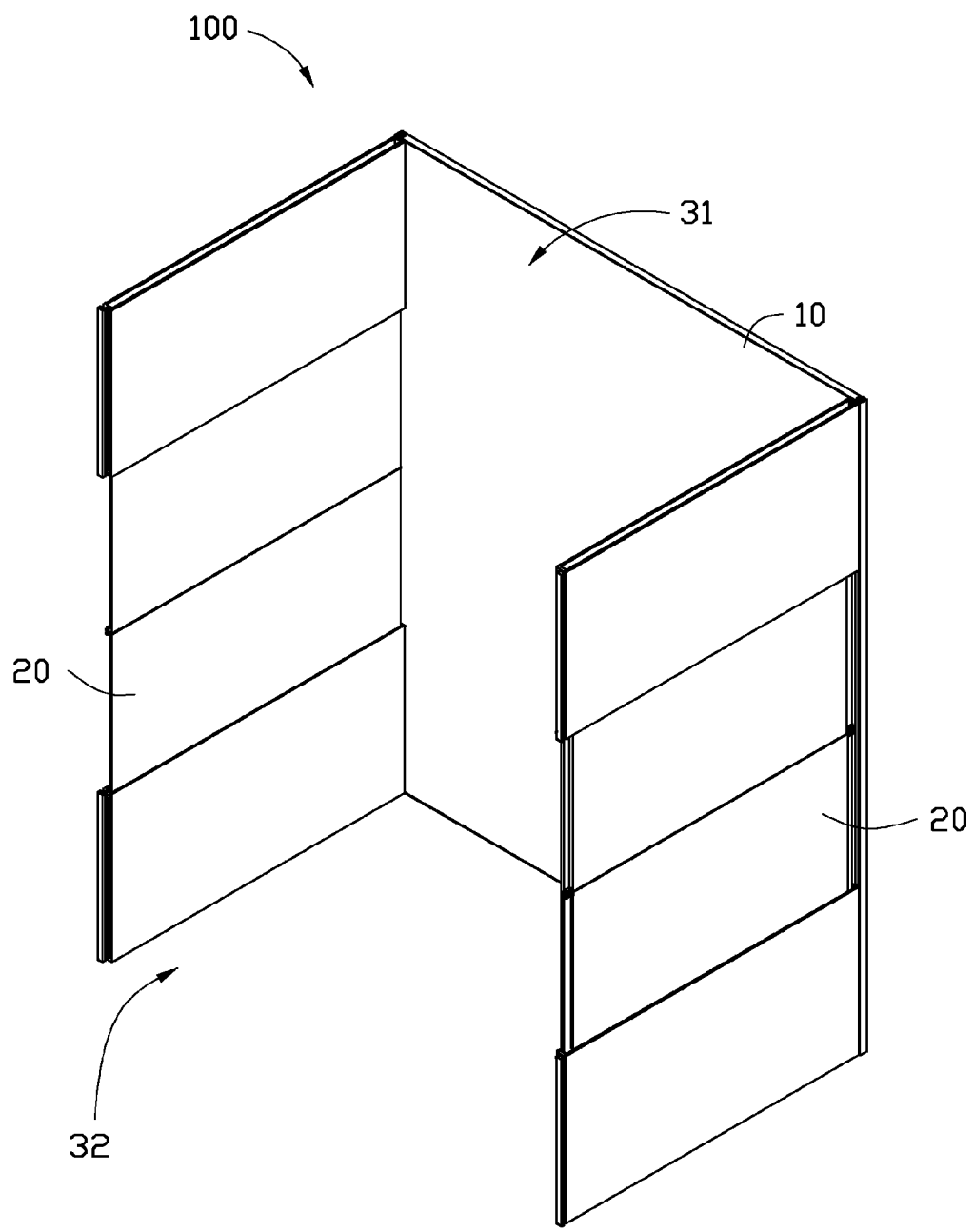
FIG. 1 is an assembled, isometric view of one embodiment of an airflow guide.

Referring to FIG. 1, an embodiment of an airflow guide 100 as disclosed includes a top cover 10 and two side covers 20. The side covers 20 are disposed on opposite sides of the top cover 10. The side covers 20 and the top cover 10 cooperatively define a first air inlet 31 and an air outlet 32 opposite to the first air inlet 31.

Figure 2:
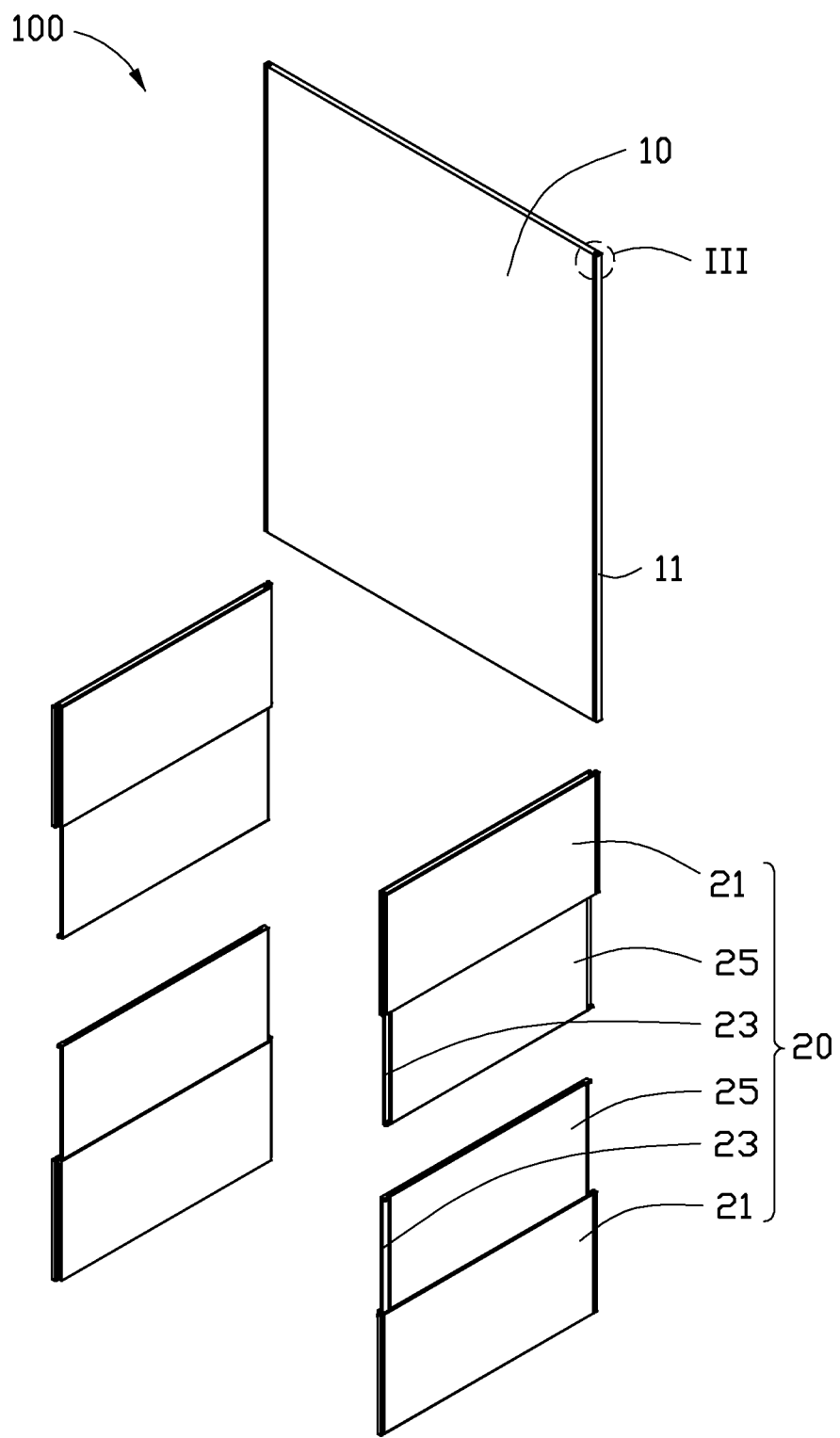
FIG. 2 is an exploded, isometric view of the airflow guide of FIG. 1.
Figure 3:
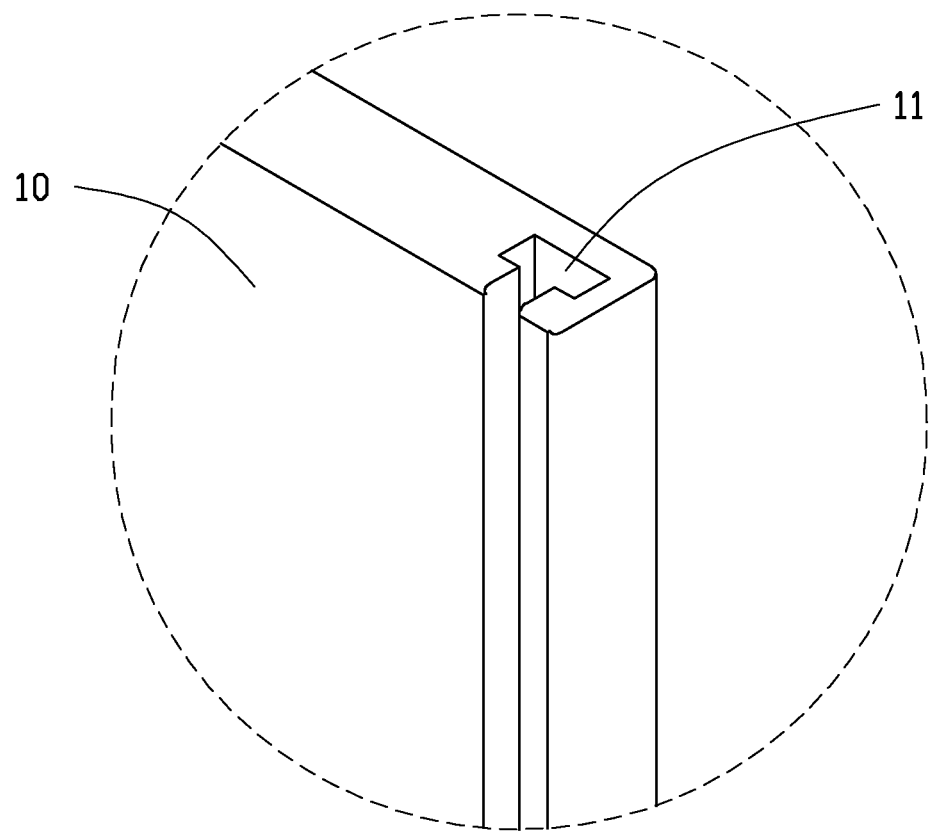
FIG. 3 is an enlarged view of a circular part III of FIG. 2.

Referring to FIGS. 2 and 3, the top cover 10 is substantially rectangular, and includes two positioning portions 11 on opposite sides thereof. In the illustrated embodiment, the two positioning portions 11 are elongated T-shaped grooves defined on opposite sides of the top cover 10.

Each side cover 20 includes two base plates 21, two sliding plates 23 and two revolving plates 25. Each sliding plate 23 is slidably connected to the corresponding base plate 21. Each revolving plate 25 is rotatably connected to the corresponding sliding plate 23.

Figure 4:
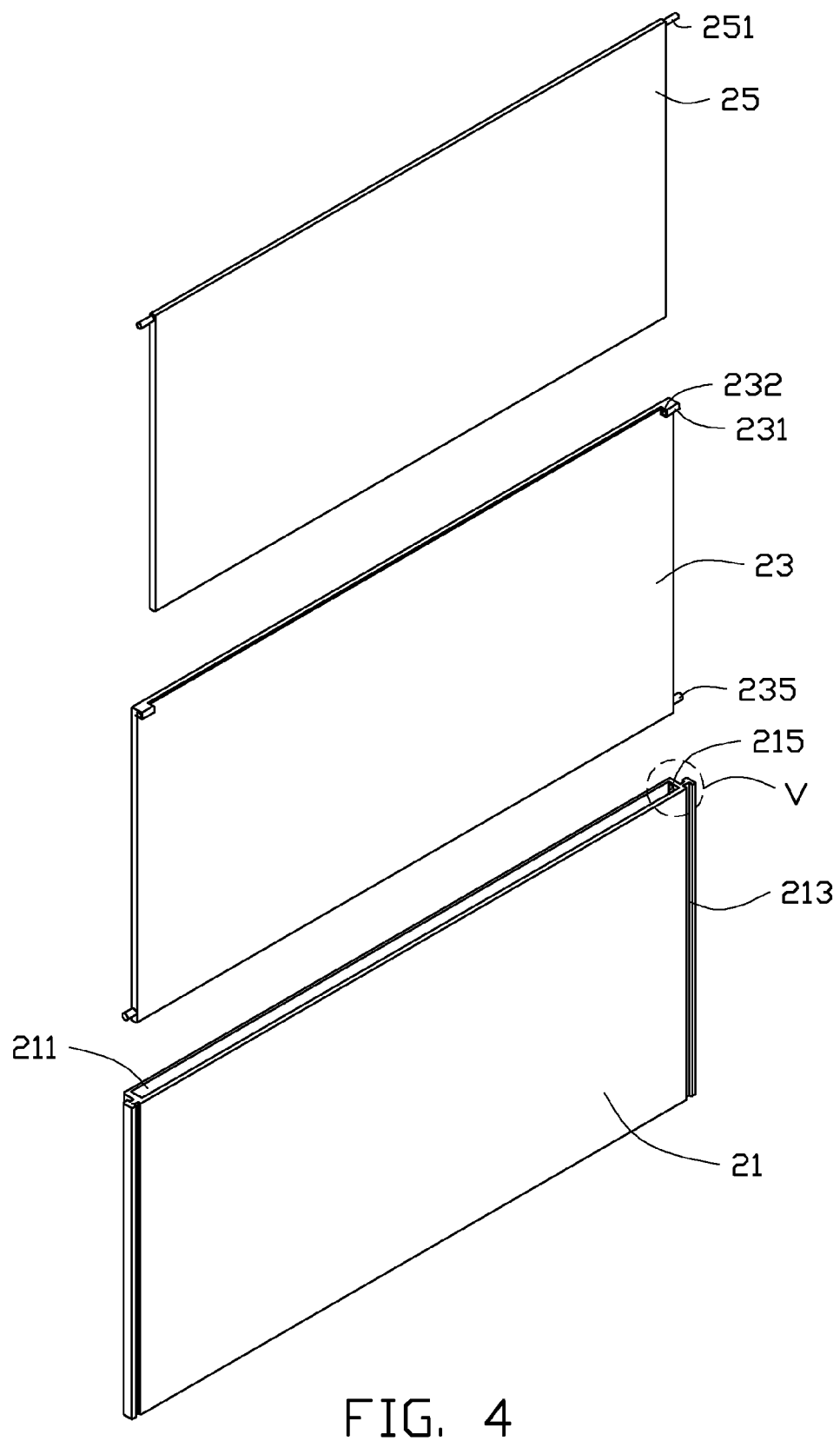
FIG. 4 is an exploded, partial, isometric view of the airflow guide of FIG. 1.
Figure 5:
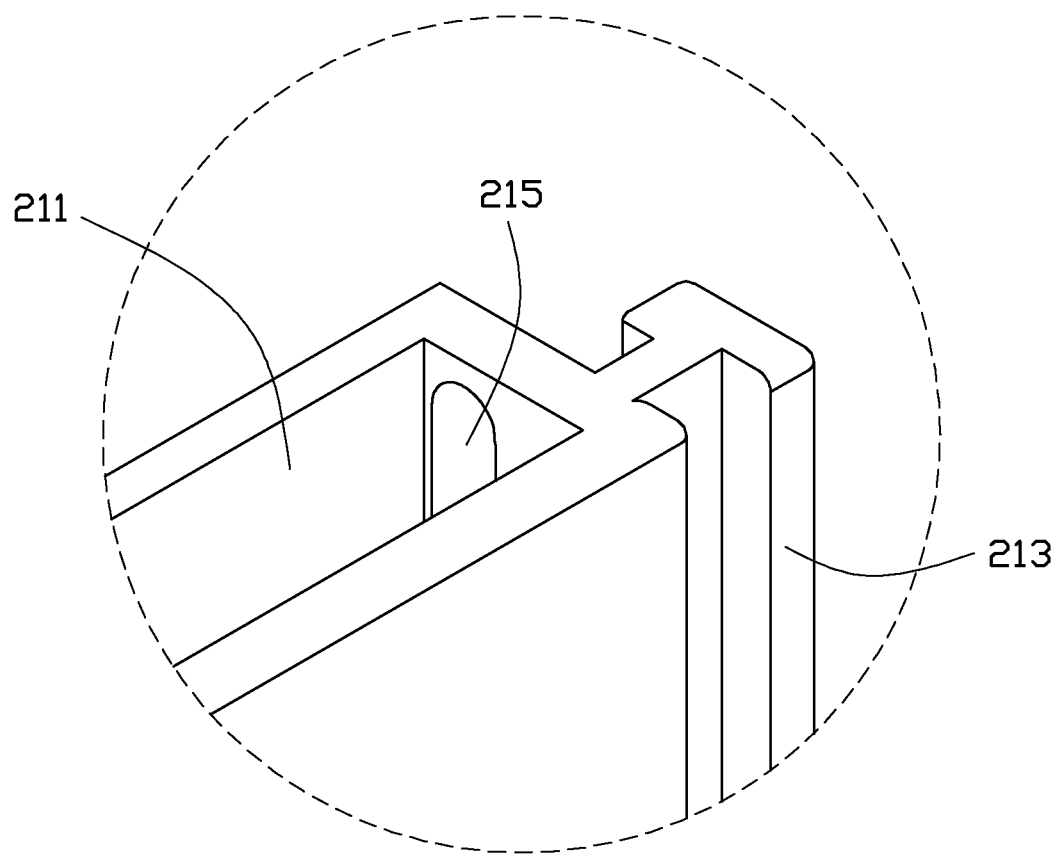
FIG. 5 is an enlarged view of circular part V of FIG. 4.

Referring to FIGS. 4 and 5, each base plate 21 is substantially rectangular, and includes a receiving portion 211 and two sliding portions 213. The receiving portion 211 is defined and extended from a side surface of the base plate 21 to a middle portion of the base plate 21 for receiving the sliding plate 23. The two sliding portions 213 are disposed on opposite sides of the base plate 21 adjacent to the receiving portion 211. The two sliding portions 213 slidably engage the positioning portion 11 of the top cover 10. The base plate 21 further defines two limiting holes 215 on opposite sides of the base plate 21 adjacent to sliding portions 213, respectively. The limiting holes 215 communicate with the receiving portion 211. In the illustrated embodiment, the sliding portions 213 are elongated T-shaped protrusions disposed on the opposite sides of the base plate 21.

Each sliding plate 23 is substantially rectangular, and includes two connecting portions 231 and two limiting protrusions 235. The two connecting portions 231 are disposed on two adjoining corners of an outer surface of the sliding plate 23, respectively. Each connecting portion 231 defines a shaft hole 232. The two limiting protrusions 235 are disposed on opposite ends of a side surface of the sliding plate 23 away from the connecting portions 231.

Each revolving plate 25 is substantially rectangular, and includes two shafts 251. The two shafts 251 are disposed on opposite ends on one side of the revolving plate 25, and received in the two shaft hole 232, respectively.

Referring to FIGS. 1 and 4, during assembly of the airflow-guide 100, one of the sliding plates 23 is received into the receiving portion 211 of one base plate 21. The limiting portions 235 of the sliding plate 23 are inserted into the limiting holes 215 of the base plate 21. The shafts 251 of one revolving plate 25 are inserted into the shaft holes 232 of the connecting portions 231 of the sliding plates 23, such that the revolving plate 25 is rotatably connected to the sliding plate 23. By repeating the steps for assembling another base plate 21, another sliding plate, and another revolving plate 25 (a side panel assembly) together, as a result, the sliding plates 23 of the two sets of side panel assemblies are combined together to form one side cover 20. The side cover 20 thus includes two base plates 21, two sliding plate 23 and two revolving plate 25. The two sliding plates 23 are disposed on a middle portion of the side cover 20 adjacent to each other. The sliding portions 213 of the base plate 21 engages with the limiting portion 11 of the top cover 10, such that the side covers 20 are fixed to the top cover 10.

Figure 6:
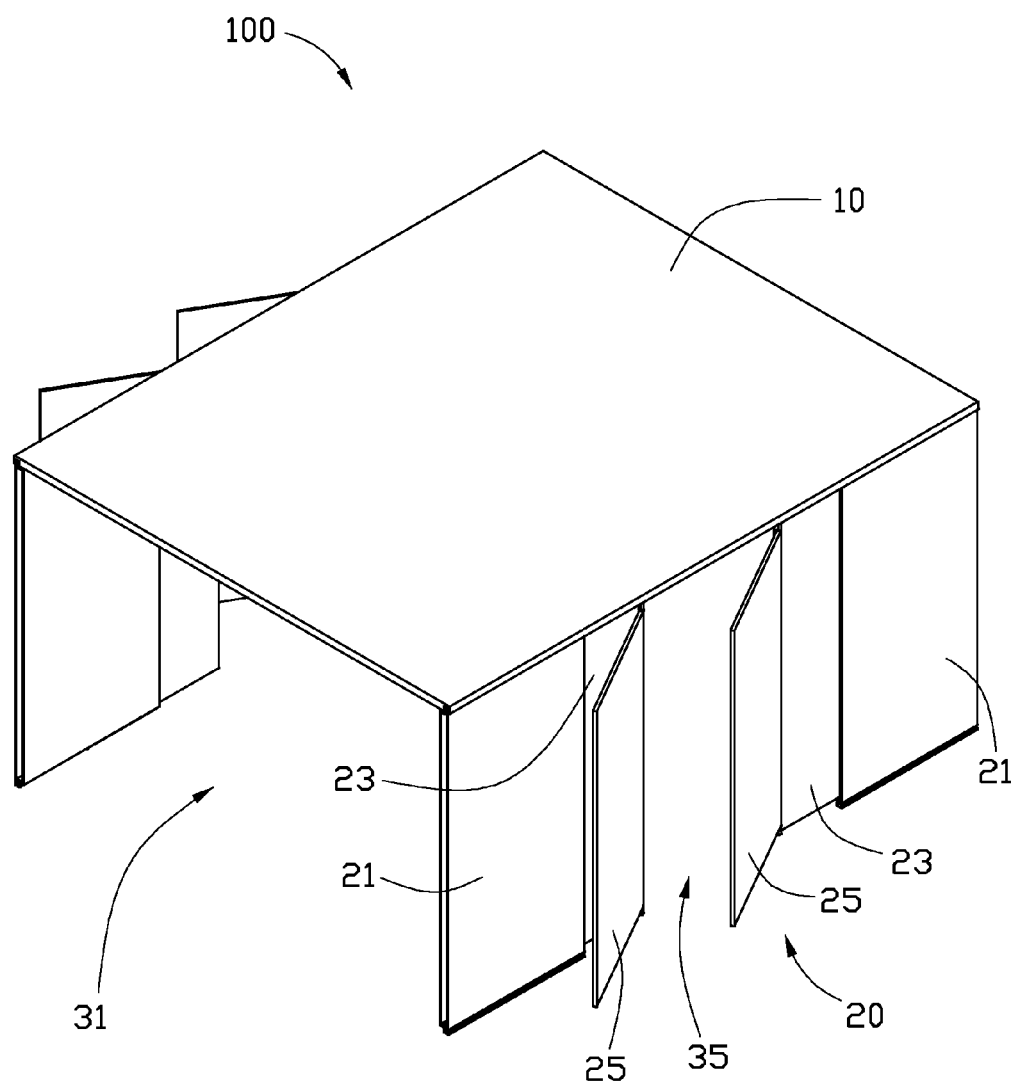
FIG. 6 is an isometric view of the airflow guide of FIG. 1 in use.

Referring to FIG. 6, when the airflow guide 100 is provided in an electronic device (not shown), the sliding plate 23 is partially received in the receiving portion 211 of the base plate 21, such that a second air inlet 35 is defined in a middle portion of the side cover 20. A cooling airflow can enter the second air inlet 35, thereby a cooling performance of the airflow guide 100 is increased. Furthermore, an opening size of the second air inlet 35 can be changed via the sliding plate 23 sliding relative to the base plate 21 according to the desired cooling requirement. The revolving plate 25 can be rotated relative to the sliding plate 23 to change an angle between the revolving plate 25 and the sliding plate 23, such that a direction of an airflow entering the second air inlet 35 can be adjusted.

It is to be understand that the sliding portion 213 can be a sliding groove, correspondingly, the positioning portion 11 can be a guiding protrusion. The revolving plate 25 can also be rotatably connected to the sliding plate 23 by a hinge. At least one of the two side cover 20 includes the base plate 21, the sliding plate 23 and the revolving plate 25. The number of the base plate 21, the sliding plate 23 and the revolving plate 25 can also be one, or more than three.

Finally, while the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure as defined by the appended claims.

What is claimed is:

1. An airflow guide comprising:
a top cover;
two side covers disposed on opposite ends of the top cover, wherein each side cover comprises two base plates fixedly connected to the top cover, two sliding plates slidably connected to the corresponding base plates and selectively positionable in a middle portion of the side covers adjacent to each other or in a retracted position within the base plates, and two revolving plates rotatably connected to the corresponding sliding plates disposed within the middle portion, each of the base plates defines a receiving portion in a side surface thereof, each of the two sliding plates is slidably receivable in the corresponding receiving portion, the two revolving plates are oppositely placed to cooperatively form an air inlet between the two sliding plates.

2. The airflow guide of claim 1, wherein the top cover comprises two positioning portions defined on opposite sides of the top cover, each base plate comprising two sliding portions disposed on opposite sides of the base plate adjoining the receiving portion to slidably engage the positioning portions.

3. The airflow guide of claim 2, wherein the positioning portions are elongated T-shaped grooves defined on opposite sides of the top cover.

4. The airflow guide of claim 2, wherein the sliding portions are a plurality of elongated T-shaped protrusions disposed on the opposite sides of each base plate.

5. The airflow guide of claim 2, wherein each base plate further defines two limiting holes on the opposite sides of the base plate adjoining the sliding portions, each sliding plate further comprising two limiting protrusions disposed on opposite ends of a side surface of the sliding plate to be received in the limiting holes.

6. The airflow guide of claim 1, wherein each sliding plate comprises two connecting portions disposed on two adjoining corners of an outer surface of the sliding plate, respectively, each connecting portion defining a shaft hole, and each revolving plate comprises two shafts disposed on opposite ends on one side of the revolving plate, and to be received in the shaft holes, respectively.

* * * * *